(12) United States Patent
Singhal et al.

(10) Patent No.: US 6,356,861 B1
(45) Date of Patent: Mar. 12, 2002

(54) DERIVING STATISTICAL DEVICE MODELS FROM WORST-CASE FILES

(75) Inventors: Kumud Singhal; V. Visvanathan, both of Allentown, PA (US)

(73) Assignee: Agere Systems Guardian Corp., Berkley Hts., NJ (US)

( * ) Notice: Subject to any disclaimer, the term of this patent is extended or adjusted under 35 U.S.C. 154(b) by 0 days.

(21) Appl. No.: 09/291,157

(22) Filed: Apr. 12, 1999

(51) Int. Cl.[7] ............................................... G06F 17/50
(52) U.S. Cl. ................... 703/2; 703/5; 703/14; 716/4; 716/5; 700/91; 702/185
(58) Field of Search ................. 703/2, 13, 5; 716/5; 716/4; 700/91, 95; 702/185

(56) References Cited

U.S. PATENT DOCUMENTS 5,548,539 A * 8/1996 Vlach et al. ................ 364/578
6,018,623 A * 1/2000 Chang et al. ............ 395/500.07

OTHER PUBLICATIONS

Kumud Singhal and V. Visvanthan, Statistical Device Models From Worst Case Files and Electrical Test Data, IEEE Transactions on Semiconductor Manufacturing, vol. 12, No. 4, Nov. 1999, pp. 470–484.

* cited by examiner

*Primary Examiner*—Kevin J. Teska
*Assistant Examiner*—Thai Phan
(74) *Attorney, Agent, or Firm*—Duane Morris & Heckscher

(57) ABSTRACT

A set of worst-case device model files is provided for a production process used to mass-produce integrated circuits having a plurality of primitive device model types. A statistical device model for the production process is derived directly from the worst-case files.

27 Claims, 3 Drawing Sheets

100

| CASES | TOX.n | P2.n | P3.n | P4.n | P5.n | P6.n | TOX.p | P2.p | P3.p | P4.p | P5.p | P6.p |
|---|---|---|---|---|---|---|---|---|---|---|---|---|
| H-H | -1 | 0.91 | 1.22 | -0.31 | 0.02 | -0.91 | -1 | 1.01 | 1.22 | -0.70 | -0.47 | -0.89 |
| LT-H | -1 | 1.15 | 0.00 | -1.59 | 1.73 | -1.07 | -1 | 1.01 | 1.22 | -0.70 | -0.47 | -0.89 |
| L-HT | 1 | -0.90 | -1.22 | 0.20 | -0.02 | 0.89 | 1 | -0.39 | 0.00 | 1.51 | -1.60 | 0.14 |
| L-L | 1 | -0.90 | -1.22 | 0.20 | -0.02 | 0.89 | 1 | -1.27 | -1.22 | 0.64 | 0.47 | 1.36 |
| HT-L | 1 | -1.20 | 0.00 | 1.79 | -1.73 | 1.26 | 1 | -1.27 | -1.22 | 0.64 | 0.47 | 1.36 |
| H-LT | -1 | 0.91 | 1.22 | -0.31 | 0.02 | -0.91 | -1 | 0.76 | 0.00 | -1.39 | 1.60 | -0.74 |
| N-N | 0 | 0.03 | 0.00 | 0.04 | 0.00 | -0.15 | 0 | 0.16 | 0.00 | 0.01 | 0.00 | -0.34 |

400

500

DERIVING STATISTICAL DEVICE MODELS FROM WORST-CASE FILES

BACKGROUND OF THE INVENTION

1. Field of the Invention

The present invention relates to techniques for deriving statistical device models for mass-produced products such as semiconductor chips.

2. Description of the Related Art

During the mass manufacture of various products, such as semiconductor chips or systems having integrated circuits (ICs), failures can occur in some of the chips produced, i.e., some of the chips are defective. For example, in mass-producing semiconductor chips, chip-to-chip variations, sometimes referred to as interdie variations, can be introduced during the fabrication process. If these variations are too far from the ideal or nominal for a given chip, the chip may not function properly because various key circuit-level performance metrics may vary too much from the maximum tolerable limits.

The individual units of the product which is mass produced may be sometimes referred to herein as chips. Chips are formed in the substrate of a physical wafer. Typically, several chips are formed in each wafer. A set of wafers that are processed together is called a lot. A wafer is a very thin, flat disc typically about 9" in diameter. The manufacturing process consists of operations on the surface and substrate of the wafer to create a number of chips. Once the wafer is completely processed, it is cut up into the individual chips, which are typically about half inch by half inch in size. A lot is thus a mass-produced set of chips or units, each of which is supposed to conform to an ideal design within certain tolerable limits.

Inevitable variations in the manufacturing process can give rise to interdie variations, which can be more or less severe depending upon the particular manufacturing process as well as upon the particular design of the product to be mass-produced. The number of chips that satisfy all performance specifications from a lot determine the parametric yield of the design and manufacturing process used with a given target foundry for mass producing the chip. Each chip 30 comprises an IC or system which itself comprises a network of several circuit-level elements such as operational amplifiers (op amps) and the like. All of these circuit-level elements are composed of so-called compact or primitive "devices," which are characterized by various compact or primitive model-level parameters. For example, a device may be a transistor or portions thereof, from which larger or more complex structures like op amps are composed. A chip thus comprises a circuit or system which comprises a network of circuit-level elements, which are themselves formed from the compact devices.

The technique of worst-case files is often used in order to model the interdie variations in a manner that is useful for circuit designers. Worst-case files represent a number of cases that include the nominal case and also various extreme cases, each of which consists of device model parameters corresponding to a particular "processing corner." Collectively, the worst-case files represent the nominal and various extremes of device behavior corresponding to the variations of a particular manufacturing process. The use of worst-case files is described in C. Michael & M. Ismail, *Statistical Modeling for Computer-Aided Design of MOS VLSI Circuits*, Kluwer Academic Publishers, Boston/Dordrecht/London, 1992.

Obviously, a higher parametric yield is desirable so that more working chips are produced in each given lot. Worst-case files are thus used by chip designers to try to achieve high parametric yield. The widths and lengths of the various primitive devices may be adjusted, by repeated simulations and/or experimentation, to achieve a high percentage of chips that are expected that satisfy the worst-case limits. Designs that are predicted to work satisfactorily when simulated with worst-case files can be expected to have high parametric yields. Thus, by adjusting the sizes (widths and lengths) of the various primitive devices and verifying via simulation with the worst-case files that the performance is satisfactory, a high parametric yield can be expected from the resulting design.

Thus, a given circuit is designed and laid out by using worst-case files. The performance of the circuit design may then be simulated for the nominal case, to ensure it satisfies the key performance metrics. The performance for other cases of interdie variation may also be checked to see if all or most of them satisfy the desired key performance metrics. If all or most (to a certain specified percentage) of these cases also perform satisfactorily, then a high parametric yield can be expected since the worst-case interdie variations (variations in important or selected circuit performance metrics) caused by manufacturing variations will still allow the circuit to perform satisfactorily. These and other aspects of using worst-case files is discussed in the Michael & Ismail text and in D. Foty, *MOSFET Modeling with Spice*, Prentice Hall, Upper Saddle River, N.J., 1997.

Such an approach may be feasible for a circuit whose specifications are not very aggressive and whose performance is not very sensitive to interdie variations. Such circuits may be "over-designed" for the nominal case so that circuit performance is still satisfactory even when there is deviation from the nominal case for many or all of the circuit performance metrics. This can result in a circuit design expected to provide satisfactory performance even at all the extreme cases.

However, the worst-case file or "case-based simulation" approach is not always feasible or optimal. For example, in some designs a number of complex, competing performance constraints may be specified. These constraints may be satisfied in the nominal case, but different performance criteria would violate their specifications to different degrees in the extreme cases. In such a situation, the case-based simulation approach does not provide the designer with any quantitative feedback on the robustness of the design. In this case, the designer may be forced to over-design or, if this is not feasible, the parametric yield will be unpredictable and possibly too low for economic viability.

The use of statistical device models (also sometimes known as statistical process models) can help to alleviate this problem. Statistical models of semiconductor devices are used to quantitatively assess the key circuit performance metrics which are expected to result from a mass manufacture in a given production process or foundry. In particular, a statistical device model allows one to predict the correlated variations of the relevant performance metrics of the population of chips to be manufactured via a given process. Thus, with a suitable statistical model it is possible to determine, to some degree of accuracy, the standard deviations and correlations of the various performance metrics of the product or system to be manufactured. The statistical device models can also allow one to more accurately determine the percentage of sample circuits that satisfy all the performance specifications, i.e., to predict the expected parametric yield. Thus, for a given schematic layout and IC design, the statistical model can be used to quantitatively assess the manufacturability of the IC design with respect to a target foundry.

Conventional approaches to statistical device modeling include Michael & Ismail; and P. Chatterjee, P. Yang, D. Hocevar & P. Cox, "Statistical Analysis in VLSI Process/Circuit Design," in *Statistical Approach to VLSI*, ed. S. W. Director & W. Maly, pp. 255–292, North-Holland, 1994. Such approaches typically assume the availability of I–V (current-voltage) measurements on a large number of units. Device model parameters are then extracted for each measured chip using standard parameter extraction techniques. From this database, the correlated distributions of the model parameters are determined and form the basis of further statistical analysis.

These conventional approaches to statistical device modeling, however, may not always be practical or optimal. For instance, in a production environment, statistical device models that capture both nominal and extreme behavior are needed early in the life cycle of a production process. Worst-case files can be generated early, since they are, to a large extent, based on process specifications. However, with conventional techniques it is difficult to produce a good statistical device model early in the life cycle of the process.

So-called "Technology CAD" tools are sometimes used to derive a statistical device model that will mimic the anticipated spread of a device manufacturing process. However, such an approach requires a mature process so that a new, complete set of I–V measurements can be made on a large number of chips, and/or the use of such tools to develop a statistical model is very complicated and resource- and time-intensive.

A number of techniques for statistical modeling have been proposed to develop statistical models while attempting to avoid these problems, such as those described in S. Nassif, "Statistical Worst-Case Analysis for Integrated Circuits," in *Statistical Approach to VLSI*, pp. 233–254; J. A. Power, B. Donnellan, A. Mathewson & W. A. Lane, "Relating Statistical MOSFET Model Parameter Variabilities to IC Manufacturing Process Fluctuations Enabling Realist Worst Case Design," *IEEE Trans. Semiconductor Manufacturing*, v. 7, no. 3, pp. 306–318, August 1994; A. Bolt, M. Rocchi & Jan Engel, "Realistic Statistical Worst-Case Simulation of VLSI Circuits," *IEEE Trans. Semiconductor Manufacturing*, v. 4, no. 3, pp. 193–198, August 1991. The primary thrust of such approaches relies on developing realistic worst-case files from a statistical analysis of certain data collected from a mature process. Such an approach typically requires, however, a mature process in order to collect the statistical data needed to derive the worst case files. This approach may not be helpful, therefore, early in the life cycle of the production process. Further, as described above, use of worst-case files for case-based simulation is not always desirable, no matter how the worst-case files are derived. There is, accordingly, a need for improved techniques for deriving statistical device models.

SUMMARY

A set of worst-case device model files is provided for a production process used to mass-produce integrated circuits having a plurality of primitive device model types. A statistical device model for the production process is derived directly from the worst-case files.

DESCRIPTION OF THE PREFERRED EMBODIMENT(S)

The present invention provides a technique for generating or deriving statistical models for a given device and manufacturing process early in the life cycle of the process, before the process is in production. Instead of developing realistic worst-case files from a statistical analysis of data collected from a mature process, and instead of conventional direct use of worst-case files to design a circuit, early in the life cycle of a process, statistical models are derived from worst-case files, as described in further detail below.

When a production process is not already in place, the data normally obtained during production is not available, yet there is still a need to develop a useful statistical device model, to quantitatively assess the key circuit performance metrics, to allow one to predict the correlated variations of the relevant performance metrics of the population of chips to be manufactured via a target process. This allows the standard deviations and correlations of the various performance metrics of the chip to be determined, and to determine the parametric yield. If the parametric yield is not high enough then the chip may be redesigned, if possible; if not, the low yield may either be tolerated or the chip production may be abandoned or another substituted in its stead. Typical performance metrics are the slew rate (SR), low-frequency gain (DC gain), gain-bandwidth (GBW), and phase margin (PM) of an op amp; or certain oscillation frequencies of a voltage-controlled oscillator (VCO), such as the frequency of oscillation when the control voltage is at a certain level such as $(V_{DD}-0.6)$V (HIGHF) and the oscillation frequency corresponding to the control voltage being 0.6V (LOWF). It is useful to be able to determine the mean and standard deviation of such performance metrics. A statistical device model can be used to determine these values.

The present invention, therefore, allows statistical device models to be developed from worst-case files alone, early in the life cycle of the production process, providing more accurate modeling than is available with conventional worst-case file techniques. The present invention therefore provides for earlier and/or more accurate determinations of the parametric yield for various chip designs, and thus provides for more efficient design and layout the chip.

Figure 1:
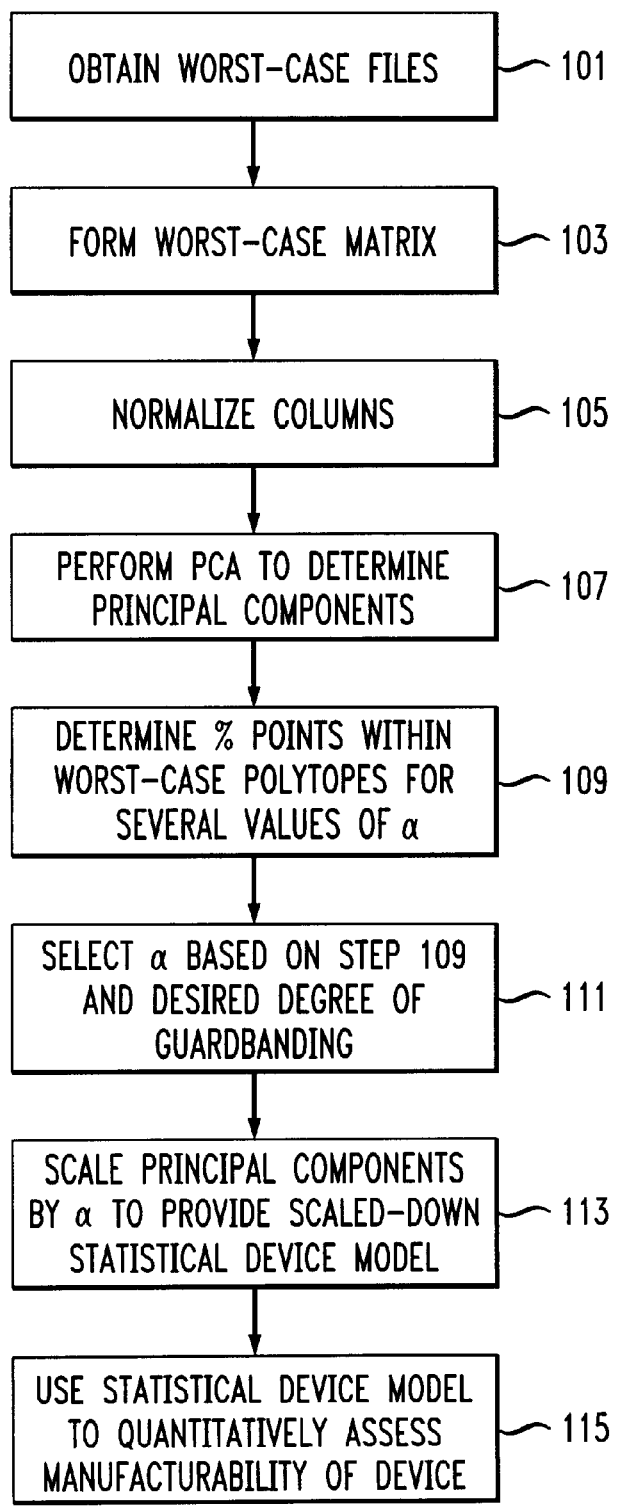
FIG. 1 is a flow chart illustrating a method for deriving a statistical device model from worst-case files, in accordance with an embodiment of the present invention.

Referring now to FIG. 1, there is shown a flow chart 100 illustrating a method deriving a statistical device model from worst-case files, according to a preferred embodiment of the present invention. First, worst-case device model files are created to match certain key specifications and engineering limits of a semiconductor manufacturing process which is under development (step 101). In the present invention, a statistical model is developed directly from the set of worst-case files, where each worst case is considered as a data point to be used to develop the statistical device models.

These worst-case files may be produced by any suitable conventional or other technique. As will be appreciated, worst-case files may be determined in various ways and may have various formats. Various techniques may be used to generate worst-case files, largely based on process specifications, as discussed in Foty. For a process under development, the anticipated spread in the performance of the mass-produced chips is often specified in terms of key electrical metrics. For MOS devices, based on process specifications, a range of values for the threshold voltage $V_{th}$ and the saturation region current at a particular bias $I_{on}$ are stated to be the target for the process. These key electrical metrics are specified for primitive or compact devices of various sizes such as the short-wide and long-wide structures. These metrics typically specify the nominal case as well as various worst-case points or "corners," which can be used to define the worst-case polygons, as will be appreciated. The worst-case files are those worst-case and nominal primitive device parameters that generate the corresponding worst-case and nominal key electrical metrics.

Figures 2, 3:
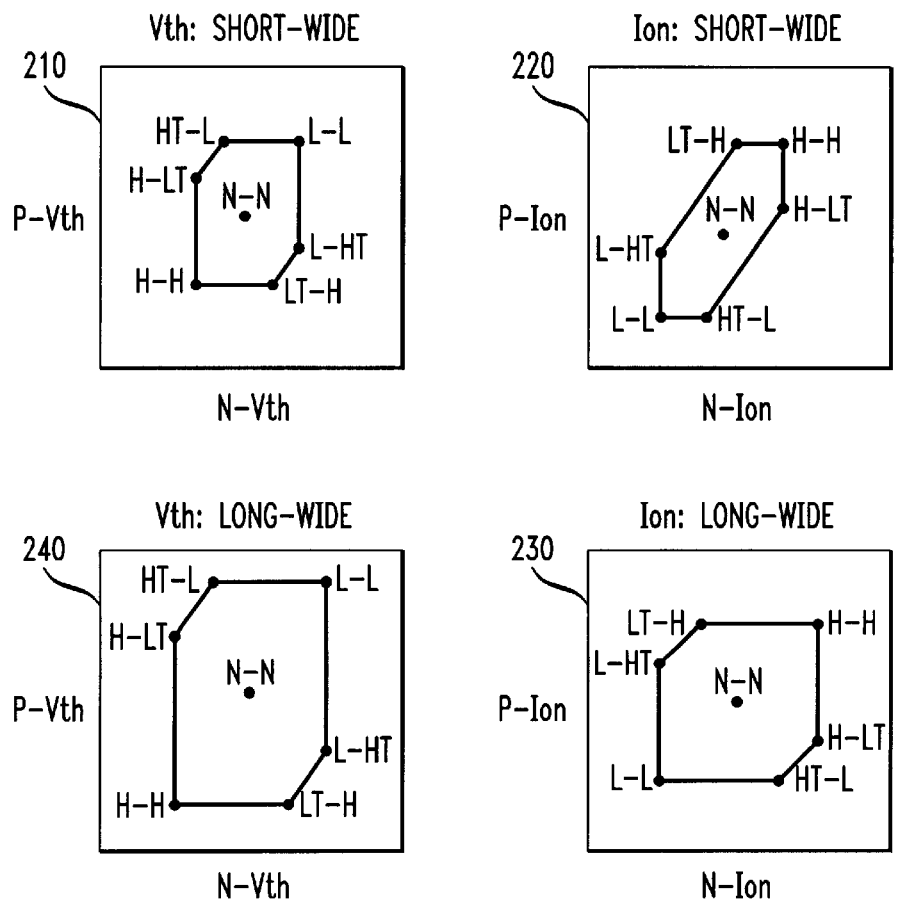
FIG. 2 illustrates four sample worst-case polygons, for use in deriving the statistical device model of the present invention in accordance with the method of FIG. 1.
FIG. 3 is a worst-case matrix for use in deriving the statistical device model of the present invention, in accordance with method of FIG. 1.

Referring now to FIG. 2, there are shown sample worst-case polygons 210, 220, 230, and 240. These polygons illustrate the worst-case data associated with the key electrical metrics ($V_{th}$, $I_{on}$) specified for each different compact or primitive structure of both nmos and pmos types. For each polygon, the nominal point N-N is shown as well as the defining contour worst-case points HT-L, L-L, L-HT, LT-H, H-H, and H-LT, where H denotes the worst-case high of the parameter in question (e.g., the n-$V_{th}$ or the p-$V_{th}$); L denotes the worst-case low; LT denotes the worst-case low of the $T_{ox}$ value (oxide thickness); and HT denotes the worst-case high $T_{ox}$ value. Thus, for example, worst-case polygon 210 shows the nominal point N-N and a polygon formed by the six-worst case points for the threshold voltage parameter $V_{th}$ for the primitive short-wide structure. Similarly, worst-case polygon 230 shows the nominal point N-N and a polygon formed by the six-worst case points for the parameter $I_{on}$ for the primitive long-wide structure. These structures may be used, for example, to form transistors. The polygons in FIG. 2, in one embodiment, represent sample worst-case polygons for 0.35–3V CMOS technology chip structures.

The worst-case polygons may be considered the worst-case "goals" around which the worst-case files are selected. From the worst-case files, there can be derived a statistical device model in accordance with method 100 of FIG. 1.

Referring now to FIG. 3, there is shown a matrix 300 for use in deriving the statistical device model of the present invention in accordance with method 100 of FIG. 1. To generate matrix 300, a standard worst-case file technique may be utilized to obtain the raw (non-normalized) worst-case files that yield or correspond to the worst case data or goals of the polygons of FIG. 2.

In generating matrix 300, first, the raw worst-case files are obtained, as described previously (step 101). Next, a matrix is formed embodying the worst-case file data (step 103). Thus, the matrix has rows which represent the various cases and columns which are the parameters of the compact models of the various devices (e.g., nmos, pmos) that differ across the cases. Thus, matrix 300 comprises rows for the six worst-case points or cases HT-L, L-L, L-HT, LT-H, H-H, and H-LT, and the nominal case N-N, and contains several columns each for both nmos and pmos devices, including $T_{ox}$.n and $T_{ox}$.p for the $T_{ox}$ values for nmos and pmos, respectively, and various other parameters for each type, namely P2.n to P6.n and P2.p to P6.p. The suffix ".n" denotes the n-channel model parameters, while the suffix ".p" denotes the p-channel model parameters. As will be appreciated, the $T_{ox}$ (or P1) parameters and the other parameters P2–P6 are other model parameters used to describe various adjustable features of the compact models.

An initial set of "measured files" may be obtained by extracting nmos and pmos model files based on extensive I–V measurements on devices of varying sizes and temperatures on a sample wafer. In one embodiment, to populate matrix 300, for each case (row), the oxide thicknesses $T_{ox}$.n and $T_{ox}$.p are set at a suitable extreme value, and the values of the other model parameters P2–P6 for each type (nmos or pmos) are determined using an optimization technique (i.e., steps 101, 103). Once the initial, non-normalized precursor to matrix 300 is generated, its data corresponds to that of the polygons of FIG. 2, as will be appreciated. Next, each column is normalized to have a mean of zero and a variance of 1 (step 105). Matrix 300 is illustrated after its columns have already been normalized in this fashion.

The next goal is to extract the underlying statistical information that is encapsulated or embodied in matrix 300. As will be appreciated, a statistical device model is represented by a few significant principal components, which are statistically independent. Thus, the technique of principal component analysis (PCA) is performed on matrix 300 using singular value decomposition, to determine the statistical structure of this limited data set (PCA is discussed in Michael & Ismail; and in C. R. Rao, *Linear Statistical Inference and its Applications*, 2d ed. (John Wiley & Sons, 1973)) (step 107). This yields the standard deviation of the "principal components" and the rotation matrix from the space of principal components to the space of normalized model parameters. Using PCA in this maimer, only certain components are retained as "principal" components if they are necessary to explain a specified percentage of the variance in the columns of data matrix 300. In one embodiment, the principal components are those necessary to explain 99%, or some other specified percentage, of the variance in the columns of data matrix 300.

Figure 4:
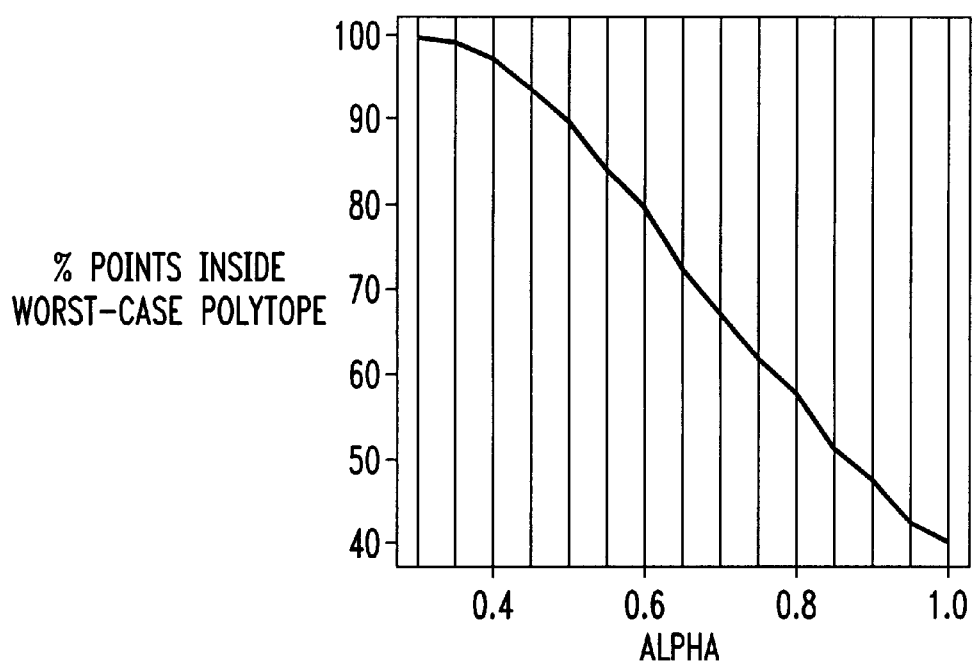
FIG. 4 is an exemplary plot 400 of the percentage of points inside worst-case polytope vs. the factor α, in accordance with an embodiment of the present invention.

The worst-case files are not random statistical samples, but are usually created to represent certain extremes of the manufacturing process. Accordingly, the standard deviation of the principal components are scaled down by a uniform scaling factor $\alpha$ in order to take into account the fact that worst-case files are biased towards the extremes of the distribution of the compact model parameters. To select a value of $\alpha$, first, for a number of values of $\alpha<1$, statistical model evaluations are performed to determine the percentage of points that lie within the polytope or polygon defined by the worst case files in the space of electrical specifications, i.e. polygons 210, 220, 230, 240 of FIG. 2, for each value of $\alpha$ (step 109). An exemplary resulting plot 400 of % of points inside worst-case polytope vs. $\alpha$ is illustrated in FIG. 4.

Thus, in the example illustrated by plot 400, for $\alpha=1$, only 40% of the samples are inside the worst-case polytope, which means that the variation encapsulated in the statistical model is far larger than that in the worst-case files. However, for $\alpha=0.35$, 99% of the samples are inside the worst-case polytope indicating that the statistical model and the worst-case files are matched in terms of the extent of variation. Some value of a is selected, based on the information generated in plot 400, the degree of "guardbanding," and other factors (step 111). Guardbanding is discussed in S. G. Duvall, "A Practical Methodology for the Statistical Design of Complex Logic Products for Performance," *IEEE Trans. VLSI Systems*, v. 3, no. 1, pp. 112–123, March 1995. Any value for $\alpha$ between these extremes may be chosen, depending on the degree of guardbanding that is to be built into the statistical device model, as will be appreciated. For example, $\alpha=0.35$ is a tight distribution corresponding to the optimistic assumption that the variations of the manufacturing process, once stable, would be the same as that predicted by the worst-case files, while $\alpha=1$ provides a wide distribution more appropriate for the cautious or pessimistic assumption that the actual variations of the manufacturing process would be more, i.e., worse than the target set by the worst case files.

The standard deviation of the principal components are then scaled down by the selected value of $\alpha$, to provide the appropriately scaled-down statistical device model (step 113). The statistical device model thus derived is then used to quantitatively assess the manufacturability of the circuit design early in the life cycle of the production process (step 115). This may be done by generating samples of device model parameters as follows. First, sample the principal components from independent normal distributions with mean 0 and standard deviation $\alpha*\sigma$, where the $\sigma$ values are provided by the PCA. Using the rotation matrix provided by the PCA, transform each sample into the space of normalized model parameters. Then, de-normalize the samples, thereby transforming them into the space of actual model parameters. These samples can now be used in conjunction with a circuit simulator for statistical circuit simulation and parametric yield estimation. Because a statistical device model is represented by a few significant principal components that are statistically independent, it is comparatively simple and efficient to use latin hypercube sampling rather than simple random sampling, which allows fewer circuit simulations to be used. The technique of latin hypercube sampling is described in R. L. Iman, J. C. Helton & J. E. Campbell, "An Approach to Sensitivity Analysis of Computer Models, Part I: Introduction, Input Variable Selection and Preliminary Variable Assessment," *Journal of Quality Technology*, v. 13, no. 3, pp. 174–183, 1981.

Use of statistical device models derived from worst-case files in this manner offers several improvements over conventional worst-case file circuit design techniques. The circuit designer often needs to run fewer simulations than with all the worst-case files. In one embodiment as determined by empirical testing, when necessary, the designer runs a larger sample set which is still only 3.5 times as expensive as the full worst-case simulation. In return, however, far more information is available about variations in circuit performance than is possible with worst-case based simulation. Thus, the present invention provides complete statistical information, unlike the conventional worst-case based techniques, with minimal circuit simulation required.

Figure 5:
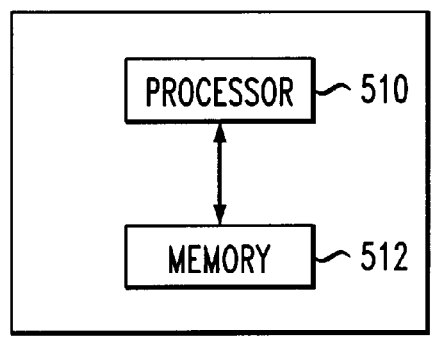
FIG. 5 is a block diagram of a computer system for implementing all or part of the method of FIG. 1.

Referring now to FIG. 5, there is shown a computer system 500 for implementing all or part of method 100 of FIG. 1. Computer system 500 comprises processor 510 and memory 512. Processor 510 is preferably a general-purpose programmable microprocessor capable of being programmed to implement all or parts of method 100, as will be appreciated.

The present invention can also be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted as a propagated computer data or other signal over some transmission or propagation medium, such as over electrical wiring or cabling, through fiber optics, or via electromagnetic radiation, or otherwise embodied in a carrier wave, wherein, when the computer program code is loaded into and executed by a computer, the computer becomes an apparatus for practicing the invention. When implemented on a future general-purpose microprocessor sufficient to carry out the present invention, the computer program code segments configure the microprocessor to create specific logic circuits to carry out the desired process.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A method for developing a statistical device model for a production process used to mass-produce integrated circuits having a plurality of primitive device model types, the method comprising the steps of:
   (a) providing a set of worst-case device model files for the production process; and
   (b) deriving the statistical device model from the worst-case files, wherein the worst-case files comprise nominal and worst-case data for model parameters for each primitive device model type, wherein the worst-case files correspond to worst-case data for key electrical metrics for each primitive device model type.

2. The method of claim 1, wherein the key electrical metrics comprise a threshold voltage metric and a saturation region current metric.

3. The method of claim 1, wherein step (b) comprises the steps of:
   (1) forming a matrix having a row for each worst-case point and a column for each model parameter;
   (2) normalizing each column of the matrix to have a mean of zero and a variance of 1; and
   (3) performing principal component analysis on the matrix to extract the principal components of the matrix necessary to explain a specified percentage of the variation in the columns of the matrix.

4. The method of claim 3, wherein step (b) comprises the further step of:
   (4) scaling the standard deviation of the principal components by a scaling factor.

5. The method of claim 1, wherein the plurality of primitive device types comprises both nmos and pmos short-wide and long-wide sized CMOS primitive device structures.

6. The method of claim 1, comprising the further step of:
   (c) using the statistical device model to determine the quantitative yield of a given integrated circuit design to be manufactured with the production process.

7. The method of claim 6, wherein steps (a)–(c) are performed before the production process is implemented.

8. The method of claim 6, wherein step (c) comprises the steps of:
   (1) using the statistical device model to determine the standard deviations and correlations of a plurality of performance metrics of the integrated circuit design; and
   (2) determining the parametric yield by using the standard deviations and correlations of the plurality of performance metrics to determine the percentage of produced integrated circuits expected to satisfy all of the performance metrics.

9. The method of claim 8, wherein: the integrated circuit design comprises a plurality of circuit-level elements constructed from one or more of the primitive device model types, the plurality of circuit-level elements comprising an operational amplifier and a voltage-controlled oscillator; and the plurality of performance metrics comprises the slew rate, low-frequency gain, gain-bandwidth, and phase margin of the operational amplifier and the oscillation frequency of the voltage-controlled oscillator at high and low control voltages.

10. A method for developing a statistical device model for a production process used to mass-produce integrated circuits having a plurality of primitive device model types, the method comprising the steps of:

(a) providing a set of worst-case device model files for the production process; and (b) deriving the statistical device model from the worst-case files, wherein the worst-case files comprise nominal and worst-case data for model parameters for each primitive device model type, wherein the worst-case files correspond to worst-case data for key electrical metrics for each primitive device model type, and wherein step (b) comprises the steps of:

(1) forming a matrix having a row for each worst-case point and a column for each model parameter;

(2) normalizing each column of the matrix to have a mean of zero and a variance of 1;

(3) performing principal component analysis on the matrix to extract the principal components of the matrix necessary to explain a specified percentage of the variation in the columns of the matrix; and (4) scaling the standard deviation of the principal components by a scaling factor, and, wherein:
the scaling factor is between 0 and 1;
a given scaling factor corresponds to a particular degree of guardbanding; and
the scaling factor is selected based on the degree of guardbanding that is to be built into the statistical device model.

11. A computer system for developing a statistical device model for a production process used to mass-produce integrated circuits having a plurality of primitive device model types, the computer system comprising:

(a) an input for receiving a set of worst-case device model files for the production process; and (b) a processor that derives the statistical device model from the worst-case files, wherein the worst-case files comprise nominal and worst-case data for model parameters for each primitive device model type, wherein the worst-case files correspond to worst-case data for key electrical metrics for each primitive device model type.

12. The computer system of claim 11, wherein the key electrical metrics comprise a threshold voltage metric and a saturation region current metric.

13. The computer system of claim 11, wherein the processor:

(1) forms a matrix having a row for each worst-case point and a column for each model parameter;

(2) normalizes each column of the matrix to have a mean of zero and a variance of 1; and (3) performs principal component analysis on the matrix to extract the principal components of the matrix necessary to explain a specified percentage of the variation in the columns of the matrix.

14. The computer system of claim 13, wherein the processor also scales the standard deviation of the principal components by a scaling factor.

15. The computer system of claim 11, wherein the plurality of primitive device types comprises both nmos and pmos short-wide and long-wide sized CMOS primitive device structures.

16. The computer system of claim 11, wherein the processor applies the statistical device model to determine the quantitative yield of a given integrated circuit design to be manufactured with the production process.

17. The computer system of claim 16, wherein the processor applies the statistical device model to determine the quantitative yield by:

(1) using the statistical device model to determine the standard deviations and correlations of a plurality of performance metrics of the integrated circuit design; and (2) determining the parametric yield by using the standard deviations and correlations of the plurality of performance metrics to determine the percentage of produced integrated circuits expected to satisfy all of the performance metrics, wherein: the integrated circuit design comprises a plurality of circuit-level elements constructed from one or more of the primitive device model types, the plurality of circuit-level elements comprising an operational amplifier and a voltage-controlled oscillator; and the plurality of performance metrics comprises the slew rate, low-frequency gain, gain-bandwidth, and phase margin of the operational amplifier and the oscillation frequency of the voltage-controlled oscillator at high and low control voltages.

18. A computer system for developing a statistical device model for a production process used to mass-produce integrated circuits having a plurality of primitive device model types, the computer system comprising:

(a) an input for receiving a set of worst-case device model files for the production process; and (b) a processor that derives the statistical device model from the worst-case files, wherein the worst-case files comprise nominal and worst-case data for model parameters for each primitive device model type, wherein the worst-case files correspond to worst-case data for key electrical metrics for each primitive device model type, where the processor:

(1) forms a matrix having a row for each worst-case point and a column for each model parameter;

(2) normalizes each column of the matrix to have a mean of zero and a variance of 1;

(3) performs principal component analysis on the matrix to extract the principal components of the matrix necessary to explain a specified percentage of the variation in the columns of the matrix; and (4) scales the standard deviation of the principal components by a scaling factor, and, wherein:
the scaling factor is between 0 and 1;
a given scaling factor corresponds to a particular degree of guardbanding; and
the scaling factor is selected based on the degree of guardbanding that is to be built into the statistical device model.

19. A method for mass-producing an integrated circuit with a production process, the integrated circuit having a plurality of primitive device model types, the method comprising the steps of:

(a) providing a set of worst-case device model files for the production process;

(b) deriving a statistical device model for the production process from the worst-case files; and (c) using the statistical device model to determine the quantitative yield of the integrated circuit to be manufactured with the production process, wherein the worst-case files comprise nominal and worst-case data for model parameters for each primitive device model type, wherein the worst-case files correspond to worst-case data for key electrical metrics for each primitive device model type.

20. The method of claim 19, wherein the key electrical metrics comprise a threshold voltage metric and a saturation region current metric.

21. The method of claim 19, wherein step (b) comprises the steps of:
   (1) forming a matrix having a row for each worst-case point and a column for each model parameter;
   (2) normalizing each column of the matrix to have a mean of zero and a variance of 1; and
   (3) performing principal component analysis on the matrix to extract the principal components of the matrix necessary to explain a specified percentage of the variation in the columns of the matrix.

22. The method of claim 21, wherein step (b) comprises the further step of:
   scaling the standard deviation of the principal components by a scaling factor.

23. The method of claim 19, wherein the plurality of primitive device types comprises both nmos and pmos short-wide and long-wide sized CMOS primitive device structures.

24. The method of claim 19, wherein step (c) comprises the steps of:
   (1) using the statistical device model to determine the standard deviations and correlations of a plurality of performance metrics of the integrated circuit; and
   (2) determining the parametric yield by using the standard deviations and correlations of the plurality of performance metrics to determine the percentage of produced integrated circuits expected to satisfy all of the performance metrics.

25. The method of claim 24, wherein:
   the integrated circuit comprises a plurality of circuit-level elements constructed from one or more of the primitive device model types, the plurality of circuit-level elements comprising an operational amplifier and a voltage-controlled oscillator; and
   the plurality of performance metrics comprises the slew rate, low-frequency gain, gain-bandwidth, and phase margin of the operational amplifier and the oscillation frequency of the voltage-controlled oscillator at high and low control voltages.

26. An integrated circuit made by the method of claim 19.

27. A method for mass-producing an integrated circuit with a production process, the integrated circuit having a plurality of primitive device model types, the method comprising the steps of:
   (a) providing a set of worst-case device model files for the production process;
   (b) deriving a statistical device model for the production process from the worst-case files, wherein the worst-case files comprise nominal and worst-case data for model parameters for each primitive device model type, wherein the worst-case files correspond to worst-case data for key electrical metrics for each primitive device model type; and wherein step (b) comprises the steps of:
      (1) forming a matrix having a row for each worst-case point and a column for each model parameter;
      (2) normalizing each column of the matrix to have a mean of zero and a variance of 1;
      (3) performing principal component analysis on the matrix to extract the principal components of the matrix necessary to explain a specified percentage of the variation in the columns of the matrix; and
      (4) scaling the standard deviation of the principal components by a scaling factor, and
   (c) using the statistical device model to determine the quantitative yield of the integrated circuit to be manufactured with the production process and, wherein:
      the scaling factor is between 0 and 1;
      a given scaling factor corresponds to a particular degree of guardbanding; and
      the scaling factor is selected based on the degree of guardbanding that is to be built into the statistical device model.

* * * * *